(12) United States Patent
Naitoh et al.

(10) Patent No.: US 7,902,586 B2
(45) Date of Patent: Mar. 8, 2011

(54) NONVOLATILE MEMORY DEVICE WITH NANO GAP ELECTRODE

(75) Inventors: Yasuhisa Naitoh, Tsukuba (JP); Tetsuo Shimizu, Tsukuba (JP); Masayo Horikawa, Tsukuba (JP); Hidekazu Abe, Tokyo (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 5 days.

(21) Appl. No.: 11/976,739

(22) Filed: Oct. 26, 2007

(65) Prior Publication Data

US 2008/0232153 A1   Sep. 25, 2008

(30) Foreign Application Priority Data

Mar. 23, 2007 (JP) ................. 2007-077212

(51) Int. Cl.
*H01L 29/78* (2006.01)
(52) U.S. Cl. ................. 257/314; 257/E27.098
(58) Field of Classification Search ........... 257/E21.094, 257/21.37, 21.373, 21.376, 314, E27.098; 977/721, 723
See application file for complete search history.

(56) References Cited

U.S. PATENT DOCUMENTS

| | | | | |
|---|---|---|---|---|
| 6,897,009 B2 * | 5/2005 | Johnson et al. | ............... | 430/315 |
| 7,138,331 B2 * | 11/2006 | Park et al. | ................... | 438/622 |
| 7,348,591 B2 * | 3/2008 | Yamauchi et al. | ................ | 257/9 |
| 7,419,849 B2 * | 9/2008 | Kumagai et al. | ................ | 438/99 |
| 7,449,710 B2 * | 11/2008 | Lung | ................................ | 257/2 |
| 2005/0136419 A1 * | 6/2005 | Lee | ................................... | 435/6 |
| 2008/0315184 A1 * | 12/2008 | Furuta et al. | .................... | 257/30 |

FOREIGN PATENT DOCUMENTS

| | | |
|---|---|---|
| JP | 10-255481 A | 9/1998 |
| JP | 2001-525606 T | 12/2001 |
| JP | 2005-079335 A | 3/2005 |
| JP | 2005-175164 A | 6/2005 |
| JP | 2006-128438 A | 5/2006 |
| JP | 2006-134954 A | 5/2006 |
| JP | 2006-231432 A | 9/2006 |
| JP | 2006-324447 A | 11/2006 |
| WO | WO-99/28914 A2 | 6/1999 |

OTHER PUBLICATIONS

"A [2]Catenane-Based Solid State Electronically Reconfigurable Switch"; Collier et al.; Science Magazine; Aug. 18, 2000, vol. 289, pp. 1172-1175.
"Quantized Conductive Atomic Switch"; Terabe et al.; Nature; Jan. 6, 2005, vol. 433, pp. 47-50.
"Resistance Switch Employing a Simple Metal Nanogap Junction"; Nanotechnology; Naitoh et al.; Nov. 28, 2006, vol. 17, No. 22, pp. 5669-5674.

* cited by examiner

*Primary Examiner* — Nathan W Ha
(74) *Attorney, Agent, or Firm* — Birch, Stewart, Kolasch & Birch, LLP

(57) ABSTRACT

A non-volatile memory device 100 contains: an insulating substrate 10; a first electrode 20 provided on the insulating substrate 10; a second electrode 30 provided on the insulating substrate 10; and a gap 40 set between the first electrode 20 and the second electrode 30, in which a distance G between the first electrode 20 and the second electrode 30 is: 0 nm<G≦50 nm.

10 Claims, 10 Drawing Sheets

(a)

(b)

(c)

NONVOLATILE MEMORY DEVICE WITH NANO GAP ELECTRODE

FIELD OF THE INVENTION

The present invention relates to a non-volatile memory device using nanogap metal electrodes.

BACKGROUND OF THE INVENTION

Further miniaturization of electric devices has been desired, in accordance with the requirements of making the devices be smaller in size and higher in density. Thus, the researches of a nanostructure have attained remarkable progress which is represented by new functional organic molecules and nanoparticles. Utilization of characteristics of a nanostructure in electric devices is considered to be effective for miniaturization of electric devices, and research institutes, companies, and the like intensively study the utilization. For example, there is a device attracting attentions that is composed of two electrodes spaced from each other by a minute gap (hereinafter, such a pair of electrodes is referred to as "nanogap electrodes") and, over the gap, a functional organic molecule is bridged. For example, the device described in Science, 289, pp. 1172-1175 (2000) is formed by arranging a catenane-based molecule in the gap of nanogap electrodes made of platinum. The above-described Science, 289, pp. 1172-1175 (2000) describes a technique in which a voltage is applied to the electrodes to subject the catenane-based molecule to an oxidation-reduction reaction, thereby the device can carry out a switching operation.

Further, a device having nanogap electrodes bridging over its gap with nanoparticles also attracts attentions. One of the examples is the device described in Nature, 433 pp. 47-50 (2005) that is formed by preparing nanogap electrodes using silver sulfide and platinum, and arranging silver particles in its gap. The above-described Nature, 433 pp. 47-50 (2005) describes a technique in which a voltage is applied to the electrodes to cause an electrochemical reaction, thereby bridging/breaking between the electrodes can be performed by use of stretching/shrinking of silver particles, that is, a switching operation can be performed.

Furthermore, in any of the conventional switching devices exemplified herein, it is difficult to make the distance of the gap between the nanogap electrodes sufficiently small. With respect to this-point, there is a technique of the method of producing nanogap electrodes having a small distance of the gap between the nanogap electrodes, for example, which is disclosed in JP-A-2005-79335 ("JP-A" means, unexamined published Japanese patent application).

SUMMARY OF THE INVENTION

In a switching device, a resistance value between nanogap electrodes largely changes. It is desired that this phenomenon is applied to memory devices.

However, any of the conventional switching devices as described above requires a special synthetic molecule or a complicated metal complex to be provided between the nanogap electrodes. Further, since these devices have a mechanism of utilizing an intramolecular chemical reaction or a reaction between different atoms, they are dependant on a direction of an applied voltage and the degradation of the device is likely to occur, resulting in the limitation of application of those memory devices.

The present invention resides in a non-volatile memory device which has a remarkably simple structure and is capable of stably performing repeatable writing, erasing, and reading-out operations.

Other and further features and advantages of the invention will appear more fully from the following description, appropriately referring to the accompanying drawings.

DETAILED DESCRIPTION OF THE INVENTION

Figure 1:
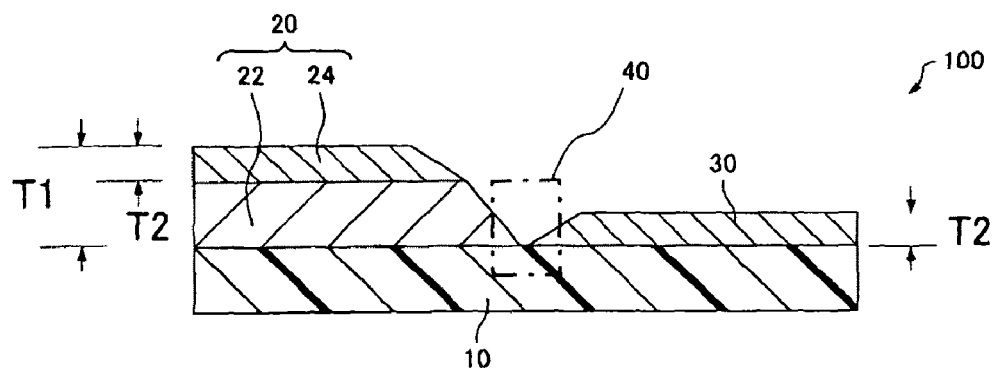
FIG. 1 is a cross-sectional view schematically showing the main part of a non-volatile memory device 100 according to an embodiment of the present invention.

The non-volatile memory device of the present invention comprises:

an insulating substrate;
a first electrode provided on the insulating substrate;

a second electrode provided on the insulating substrate; and a gap set between the first electrode and the second electrode, wherein a distance G between the first electrode and the second electrode is: 0 nm<G≦50 nm.

Formation of a device into the above-described structure can provide a non-volatile memory device having a remarkably simple structure and capable of stably performing repeatable writing, erasing, and reading-out operations.

In the present invention, the distance G means a distance between the first electrode and the second electrode at a closest site of the gap between the electrodes.

In the non-volatile memory device of the present invention, the distance G between the first electrode and the second electrode can be set to: 0.1 nm≦G≦20 nm.

In the non-volatile memory device of the present invention, the distance G between the first electrode and the second electrode can be set to: 0.1 nm≦G≦13 nm.

In the non-volatile memory device of the present invention, a material of the first electrode can be one selected from the group consisting of gold, silver, platinum, palladium, nickel, aluminum, cobalt, chromium, rhodium, copper, tungsten, tantalum, carbon, iron, titanium, and an alloy thereof.

In the non-volatile memory device of the present invention, a material of the second electrode can be one selected from the group consisting of gold, silver, platinum, palladium, nickel, aluminum, cobalt, chromium, rhodium, copper, tungsten, tantalum, carbon, iron, titanium, and an alloy thereof.

In the non-volatile memory device of the present invention, at least one of the first electrode and the second electrode can be formed into a multilayer structure.

In the non-volatile memory device of the present invention, an electrical resistance value between the first electrode and the second electrode can be either a first resistance value of 1 kΩ to 10 MΩ or a second resistance value of 100 kΩ to 100 TΩ, and the second resistance value is larger than the first resistance value.

BEST MODE FOR CARRYING OUT THE INVENTION

One example of preferred embodiments of the present invention will be described below, referring to the drawings.

1. Non-Volatile Memory Device

Figure 2:
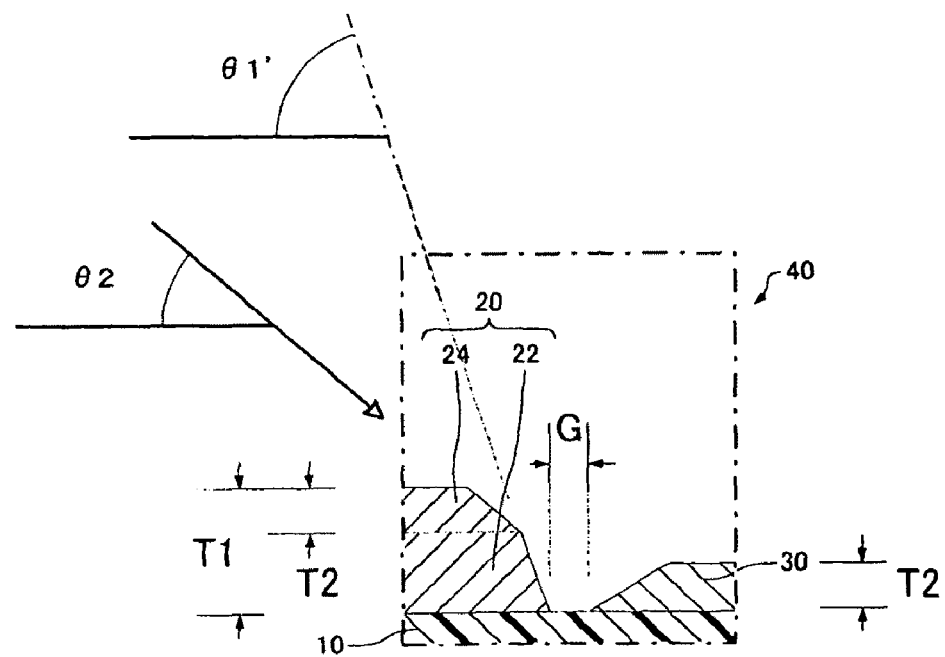
FIG. 2 is an enlarged cross-sectional view schematically showing the main part of the non-volatile memory device 100 according to the above embodiment.
Figure 3:
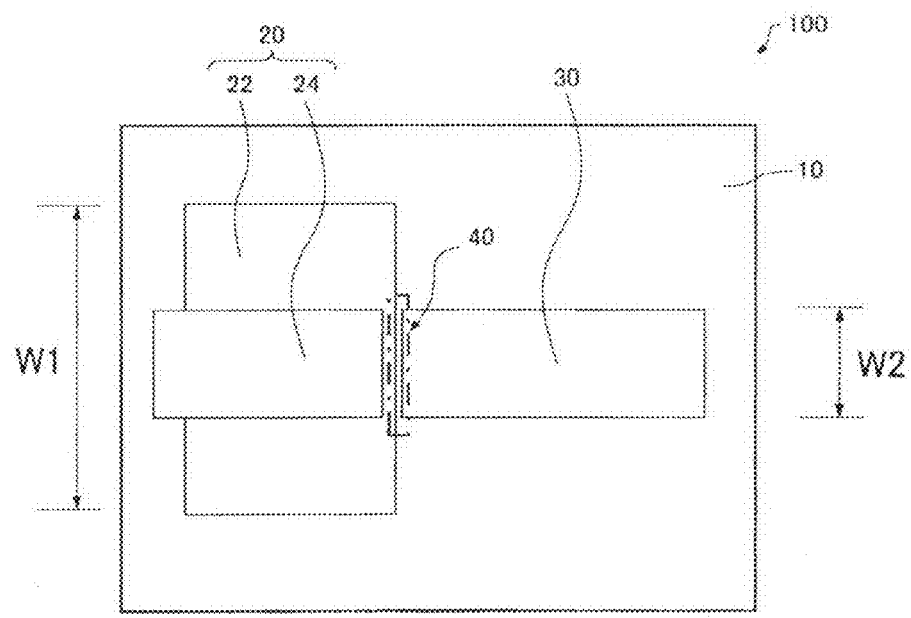
FIG. 3 is a plan view schematically showing the main part of the non-volatile memory device 100 according to the above embodiment.
Figure 4:
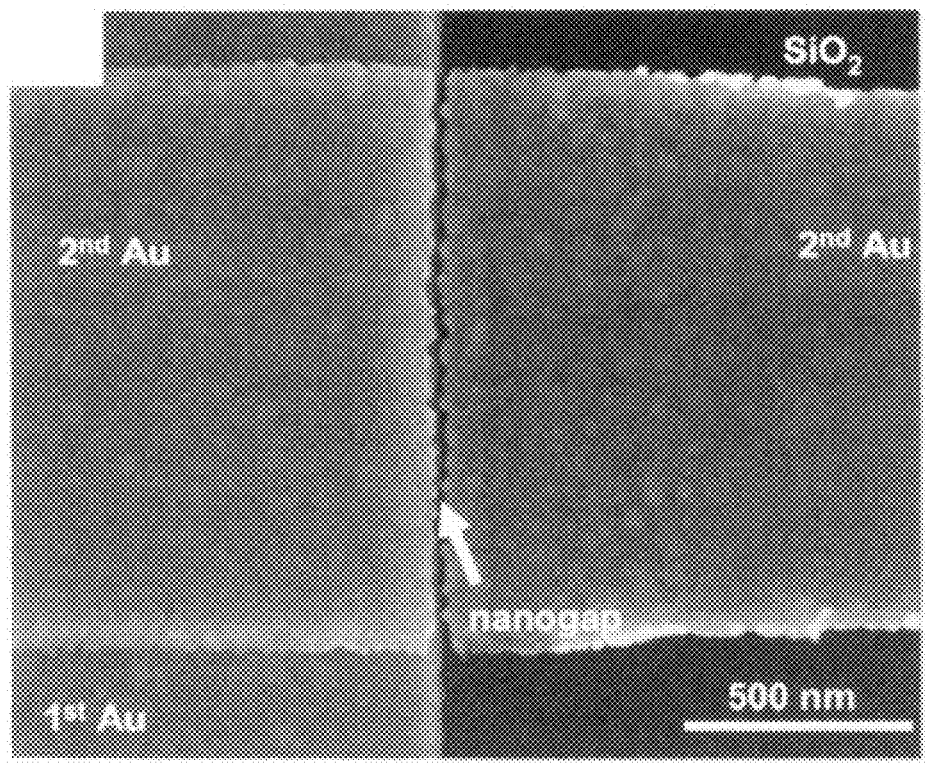
FIG. 4 is a scanning electron microscopic photograph of the main part of a non-volatile memory device 100 according to an embodiment of the present invention.

FIG. 1 is a cross-sectional view schematically showing the main part of a non-volatile memory device 100 of the present embodiment. FIG. 2 is an enlarged cross-sectional view schematically showing the main part of the non-volatile memory device 100. FIG. 3 is a plan view schematically showing the main part of a non-volatile memory device 100 of the present embodiment. FIG. 4 is a scanning electron microscopic photograph of the main part of a non-volatile memory device 100 of the present embodiment.

The non-volatile memory device 100 according to the present embodiment has an insulating substrate 10, a first electrode 20 provided on the insulating substrate 10, a second electrode 30 provided on the insulating substrate 10, and a gap 40 set between the first electrode 20 and the second electrode 30, wherein a distance G between the first electrode and the second electrode is: 0 nm<G≦50 nm.

The insulating substrate 10 has a function as a support for providing two electrodes 20 and 30 of the non-volatile memory device 100 thereon such that the electrodes are separated from each other. The insulating substrate 10 is not particularly limited in structure and material as long as it has an insulating property. For example, the shape of a surface of the insulating substrate 10 may be plane (or flat) or uneven.

Further, for example, a semiconductor substrate, such as Si, having an oxidized layer provided on the surface thereof may be used as the insulating substrate 10; or alternatively, an insulating substrate may be used as it is. The material of the insulating substrate 10 is preferably glass; oxides, such as silicon oxide ($SiO_2$); or nitrides, such as silicon nitride ($Si_3N_4$). Among them, silicon oxide ($SiO_2$) is preferable as the material of the insulating substrate 10, from the viewpoint that an adhesive property with the electrodes 20 and 30 as described later is favorable and the free degree of manufacturing the substrate are large.

The first electrode 20 is provided on the insulating substrate 10. The first electrode 20 is one electrode of the non-volatile memory device 100, and forms a pair with the second electrode 30 as described later, and the electrodes make it possible to form a higher state and a lower state in electrical resistance between the electrodes. The first electrode 20 has a shape obtained by laminating/stacking a first electrode upper part 24 on a first electrode lower part 22, as shown in FIGS. 1 to 3. The total thickness of the first electrode lower part 22 and the first electrode upper part 24 is represented by the reference numeral of T1, and the thickness of the first electrode upper part 24 is represented by the reference numeral of T2. The shape of the first electrode lower part 22 has a width W1 (see FIG. 3) in a transverse direction of an end side opposed to (and parallel to the edge of) the second electrode 30 as described later, and W1 is preferably in a range of: 5 nm≦W1. The thickness T1 of the first electrode 20 is preferably: 10 nm≦T1, at the site where the first electrode lower part 22 and the first electrode upper part 24 are stacked. The material of the first electrode 20 is preferably at least one selected from gold, silver, platinum, palladium, nickel, aluminum, cobalt, chromium, rhodium, copper, tungsten, tantalum, carbon, iron, titanium, and an alloy thereof. Further, in order to enhance the adhesive property with the insulating substrate 10, two or more different metal layers laminated/staked may be used. For example, the first electrode lower part 22 can be formed of a lamination/stacked structure of chromium and gold.

The second electrode 30 is provided on the insulating substrate 10. The second electrode 30 is the other electrode of the non-volatile memory device 100, and forms a pair with the first electrode 20 as described above, and the electrodes make it possible to form the higher state and the lower state in electrical resistance between the electrodes. The width W2 of the site of the second electrode 30 in a transverse direction opposed to the first electrode 20 is preferably in a range of: 5 nm≦W2≦W1. The thickness of the second electrode 30 will be described in details in the descriptions on production steps, and is the same as the thickness of the first electrode upper part 24 and therefore is represented by the reference numeral of T2. The thickness T2 of the second electrode 30 is preferably: 5 nm≦T2, from the viewpoints of the physical strength of the electrode and the peeling strength from the support. The material of the second electrode 30 is preferably at least one selected from gold, silver, platinum, palladium, nickel, aluminum, cobalt, chromium, rhodium, copper, tungsten, tantalum, carbon, iron, titanium, and an alloy thereof. Further, in order to enhance the adhesive property with the insulating substrate 10, two or more different metal layers laminated/staked may be used. For example, the second electrode 30 can be formed of a lamination/stacked structure of chromium and gold.

The gap 40 between the electrodes is provided such that the distance G between the first electrode 20 and the second electrode 30 would be: 0 nm<G≦50 nm. Preferably, it can be set to: 0.1 nm≦G<20 nm. More preferably, it can be set to: 0.1 nm≦G≦13 nm. The gap 40 between the electrodes has a role of carrying non-volatile memory information of the non-volatile memory device 100. The closest site between the electrodes may be formed at one or more position in a region where the first electrode 20 is opposed to the second electrode 30. Although an electric field applied between the electrodes allows atoms to transport/migrate, to change a resistance between those, the distance G preferable for this purpose depends on the material of the electrode, and the like. However, regardless of the material of the electrodes, the case where the distance G between the electrodes exceeds 50 nm is not preferable, because atoms migrate and an electric field for operating the non-volatile memory device 100 runs short. The case where the distance G between the electrodes is 0 nm is not preferable, because the first electrode 20 and the second electrode 30 cause short-circuit. Although it is difficult to determine the lower limit of the distance G by microscopy observation, it is determined as a shortest distance in which a tunnelling current can generate. That is, the lower limit is a theoretical value of a distance when the quantum mechanical tunnelling effect is observed, at the time of operating the device, under a condition that the current-voltage characteristics are not under the Ohm principle.

A sealing member may be provided on the non-volatile memory device 100 of the present embodiment. The sealing member can be provided, for example, such that the gap 40 between the electrodes as described above is at least enclosed with the sealing member. When the sealing member is provided, it is possible to bring the gap 40 between the electrodes into no contact with the air. The formation of the sealing member makes it possible to further stably operate the non-volatile memory device 100. As the material of the sealing member, for example, any semiconductor sealing materials can be used. In the case of forming the sealing member, the inside of the sealing member can be made a reduced pressure state, and also filled with various materials. The pressure P of the inside of the sealing member can be set to: $10^{-9}$ Pa<P<2×$10^5$ Pa. Alternatively, the inside of the sealing member can be filled with a dry air; an inert gas, such as a rare gas or nitrogen gas; or an electrically inert organic solvent, such as toluene.

2. Method of Producing Memory Device

The method of producing the non-volatile memory device 100 can have the following steps.

The method comprises: (1) a step of preparing an insulating substrate 10; (2) a first resist pattern formation step; (3) a first vapor-deposition step; (4) a first lift-off step; (5) a second resist pattern formation step; (6) a second vapor-deposition step; (7) a second lift-off step; and (8) an electric field breaking step. The first electrode 20 is composed of the first electrode lower part 22 and the first electrode upper part 24, and the reference numerals are those as shown in FIG. 1.

Figure 5:
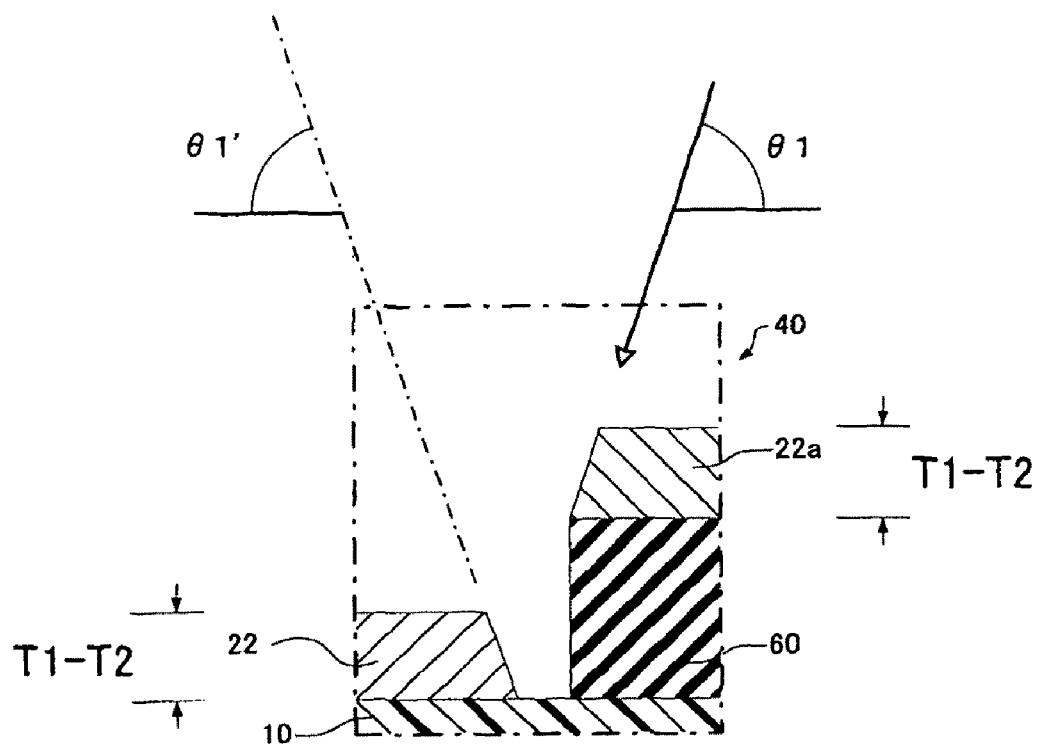
FIG. 5 is a cross-sectional view schematically showing a first vapor-deposition step in the production process of a non-volatile memory device according to an embodiment of the present invention.
Figure 6:
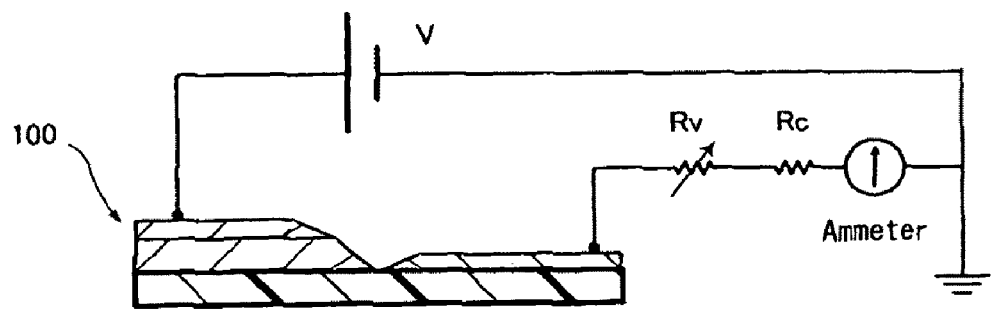
FIG. 6 is a view schematically showing a circuit to be formed in an electric field breaking step in the production process of a non-volatile memory device according to an embodiment of the present invention.

These steps are disclosed in JP-A-2005-79335. The nanogap electrodes can be produced, according to the methods described in JP-A-2004-259748 and JP-A-2005-175164, in addition to those in the above JP-A-2005-79335. In the present embodiment, the non-volatile memory device 100 is produced, according to the method described in JP-A-2005-79335. The steps of the method will be described below with referring to FIGS. 1 to 3, 5 and 6. FIG. 5 is a schematic view for explaining the first vapor-deposition step. FIG. 6 is a schematic diagram of a circuit to be formed in the electric field breaking step (8).

(1) Step of Preparing the Insulating Substrate 10

As the insulating substrate 10, use may be made of a commercially available glass substrate, a Si substrate with an oxidized layer, or other substrate having an insulating surface. Further, in the case of using an electroconductive substrate of Si or the like, a desired insulating layer is formed on the surface of the substrate by any method, such as heat treatment, oxidation treatment, vapor-deposition, or sputtering, and the thus-obtained substrate can be used as the insulating substrate 10.

(2) Step of Forming a First Resist Pattern

On the thus-prepared insulating substrate 10, a resist pattern 60 for forming the first electrode lower part 22 is formed, by using any method, such as photolithography. The thickness of the resist pattern 60 can be set to, for example, 1 μm.

(3) Step of Conducting First Vapor Deposition

The first vapor-deposition step is a step for forming the first electrode lower part 22. This step can be carried out by using any vapor-deposition apparatus. A surface on which vapor deposition is performed and which is positioned as the upper surface of the insulating substrate 10, is arranged such that the surface on which vapor deposition is performed inclines in the view of the surface from a vapor-deposition source. As shown in FIG. 5, an angle formed of the surface on which vapor deposition is performed and the direction of flying particles vaporized from the vapor-deposition source is define as θ1, and the angle θ1 is set to: 0°<θ1<90° (hereinafter, this vapor-deposition method is referred to as "inclined deposition"). As a result, as shown in FIG. 5, the first electrode lower part 22 is formed into a shape having an inclined tip portion. In this case, an angle formed of the inclined surface of the tip portion of the first electrode lower part 22 and the surface of the substrate 10 is defined as θ1'. This angle θ1' can be changed, by the edge shape of the resist pattern 60, the characteristics of the surface of the substrate 10 on which a metal is deposited, the size of the angle θ1, or the like. This angle θ1' can be formed with a good reproduction under the same conditions, and therefore the size of θ1' can be determined by separately measuring the results of vapor-deposition under the same conditions.

Further, it is preferable that the distance between the vapor-deposition source and the surface on which the vapor-deposition is performed at the time of conducting vapor-deposition is longer, since the parallel property of vapor-deposition lines enhances. This distance depends on a vapor-deposition apparatus to be used, but when the distance is about 500 mm or more, vapor-deposition necessary for the present embodiment can be performed. The first vapor-deposition step is performed by vapor-deposition, via one or plural times, of a material selected form gold, silver, platinum, palladium, nickel, aluminum, cobalt, chromium, rhodium, copper, tungsten, tantalum, carbon, iron, titanium, and an alloy thereof. The vapor-deposition via plural times may be performed, for example, after vapor-depositing chromium, gold may be vapor-deposited, thereby to form a two-layered structure. The thickness T1-T2 of the first electrode lower part 22 obtained in the first vapor-deposition step can be set to, in the case of using gold as a material thereof, 5 nm or more.

(4) Step of Conducting First Lifting-Off

The first lift-off step is carried out by using any method. This step employs a stripping solution which fits to the material of the resist pattern 60 to be used. Thus, the first electrode lower part 22 is formed, and at the same time, a sacrifice electrode 22a which has been formed on the resist pattern 60 is removed (see FIG. 5).

(5) Step of Forming a Second Resist Pattern

The second resist pattern formation step is carried out by using any method, such as a photolithography method. In this step, the opening portions (not shown in the drawings) of the resist pattern for forming the second electrode 30 and the first electrode upper part 24 are formed. The opening portions of the resist pattern are provided so as to cross the tip portion (a portion which becomes one of the nanogap electrodes) of the first electrode lower part 22 obtained in the above-mentioned step. The thickness of the resist pattern is arbitrarily set.

(6) Step of Conducting Second Vapor Deposition

In the second vapor-deposition step, the second electrode 30 is formed. According to this, the first electrode upper part 24 is incidentally formed (see FIG. 2). This step can be carried out by using a generally known vapor-deposition apparatus. In this step, the inclined deposition is performed. As shown in FIG. 2, an angle formed of the surface on which vapor deposition is performed and the direction of flying particles vaporized from the vapor-deposition source is define as θ2, and the angle θ2 is set to: $0°<θ2<θ1'<90°$, in the case of $θ1'<90°$; and is set to: $0°<θ2<90°$, in the case of $90°<θ1'$. In this step, the tip portion of the second electrode 30, that is, a portion opposed to the first electrode 20 (the first electrode lower part 22) is formed. Similar to the first vapor-deposition step, in the second vapor-deposition step, it is preferable that the distance between the vapor-deposition source and the surface on which the vapor-deposition is performed at the time of vapor-deposition is longer, since the parallel property of flying orbits of vaporized particles enhances. This distance depends on a vapor-deposition apparatus to be used, but when the distance is about 500 mm or more, vapor-deposition necessary for the present embodiment can be performed. The second vapor-deposition step is performed by vapor-deposition, via one or plural times, of a material selected form gold, silver, platinum, palladium, nickel, aluminum, cobalt, chromium, rhodium, copper, tungsten, tantalum, carbon, iron, titanium, and an alloy thereof.

Meanwhile, the formation of the gap 40 between the electrodes utilizes the shadow of the first electrode lower part 22 which is formed form the vaporized particles in the inclined deposition of the second vapor-deposition step. Thus, by adjusting at least one of the thickness of the first electrode lower part 22 and the angle θ2 of the inclined deposition in the second vapor-deposition step, the gap 40 having a desired distance G between the electrodes can be obtained.

(7) Step of Conducting Second Lifting-Off

The second lift-off step is carried out by using any method. This step employs a stripping solution which fits to the material of the resist pattern to be used. Thus, the first electrode 20 and the second electrode 30 are formed, to give the target nanogap electrodes.

(8) Step of Breaking Electric Field

The nanogap electrodes obtained as described above may occur short circuit in some cases. In the of the short circuit, if necessary, the present step can be performed. The electric field breaking step can be performed by using a method described in Appl. Phys. Lett., 75 (1999) 301. FIG. 6 is a schematic diagram of the circuit for performing the electric field breaking step. A variable resistance Rv, a fixed resistance Rc, and a power source are connected in series to the electrodes caused short-circuit, and a voltage is applied to the resultant circuit. The fixed resistance Rc is to be provided so as not to allow a current to flow at an amount exceeding a necessary amount to cause breakage of the electrodes. The necessary amount of a current for breaking a short-circuit between the electrodes is several mA to several tens mA. The resistance value of the variable resistance Rv is adjusted so as to slowly decrease from the initial value (large resistance), and the adjustment is stopped when a current does not flow, whereby the nanogap electrode having a desired distance G between the electrodes, that is, the non-volatile memory device 100, can be obtained.

FIG. 4 shows the result of observing the main part of the non-volatile memory device 100 formed as described above, with a scanning electron microscopy. From FIG. 4, the first electrode lower part 22 (designated as "$1^{st}$ Au") and the first electrode upper part 24 (designated as "$2^{nd}$ Au") were observed on the left side, and the surface (designated as "$SiO_2$") of the insulating substrate 10 and the second electrode 30 (designated as "$2^{nd}$ Au") were observed on the right side. In addition, the gap 40 (designated as "nanogap") between the electrodes having the distance G of about 10 nm was observed at the central portion of the photograph of FIG. 4.

3. Operation of the Non-Volatile Memory Device 100

The non-volatile memory device 100 takes at least states corresponding to "0" and "1", respectively, as electronic states for memory. These states can correspond to the resistance values between the electrodes, and, for example, a higher resistance state can correspond to "1" and a lower resistance state can correspond to "0". The non-volatile memory device 100 can store information, by utilizing such resistance states.

The resistance values in the higher resistance state and the lower resistance state can be selected, for example, from the range of 100 kΩ to 100 TΩ as the second resistance value, and from the range of 1 kΩ to 10 MΩ as the first resistance value, respectively. Further, the second resistance value is selected so as to become larger than the first resistance value, thereby forming the non-volatile memory device 100.

Figure 7:
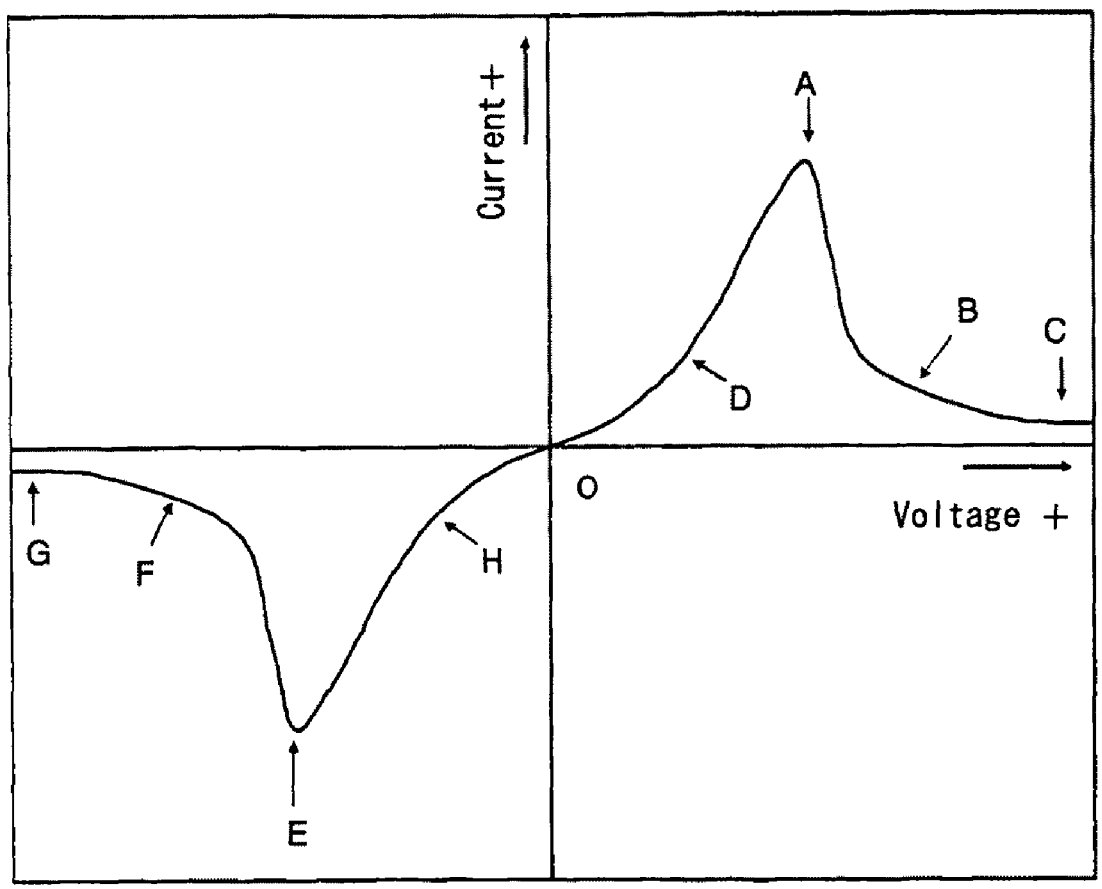
FIG. 7 is a schematic diagram showing an example of a current-voltage curve of a non-volatile memory device having nanogap electrodes.

First, with referring to FIG. 7, the following description will be made on basic characteristics of the nanogap electrodes which the non-volatile memory device 100 has. FIG. 7 schematically shows an example of a current-voltage curve (I-V curve) of the nanogap electrodes. The horizontal axis of FIG. 7 corresponds to a voltage applied to the nanogap electrodes, and the vertical axis of FIG. 7 corresponds to a current. For explanation, reference numerals of A to H and 0 are shown in FIG. 7.

The current-voltage curve of the nanogap electrodes is symmetrical with respect to the point 0, because applied voltage and current do not depend on polarity. For this reason, the right half part of FIG. 7, that is, the part of a positive voltage will be described in the below, and the description on the part of a negative voltage is omitted. The operation in the part of the negative voltage can be read and understood, by suitably changing the polarity in the following description to the opposite polarity.

In the current-voltage curve of the nanogap electrodes, an applied voltage increases from the point 0, and a current shows the maximum value at the point A. Further, in the region of a voltage higher than that at the point A, a negative differential resistance (NDR) effect is shown in which as the applied voltage increases, the current increases. In this region, the tip shape of each electrode of the nanogap electrodes changes depending on the applied voltage. That is, as the applied voltage becomes higher, the gap 40 between the electrodes becomes larger. In comparison of the gap between the electrodes at the point B with the gap between those at the point C, the gap at the point C becomes larger. The region which can change the size of the gap 40 between the electrodes in the above manner is referred to as "transition region" hereinafter. Further, the end of the lower voltage side of the transition region, that is, the voltage in the vicinity of the point A is referred to as "threshold voltage" in some cases. Herein, the threshold voltage is set to a value in the vicinity of the point A, since the threshold voltage may be slightly sifted from the point A of FIG. 7 by an operation voltage, a measurement environment, or the like, in some cases.

Next, an example of the operation of the non-volatile memory device 100 is described.

First, the following is a description on the writing operation of the non-volatile memory device 100. A voltage in the transition region of FIG. 7, that is, a voltage higher than the voltage at the point A is applied, and the voltage is instantaneously changed to a voltage at a region other than the transition region, that is, a voltage between points A and E. Thus, while maintaining the size of the gap 40 between the electrodes corresponding to the former applied voltage in the transition region, the state becomes a state that the voltage is removed, or a state that a lower voltage is applied. On the other hand, a state of applying a voltage in the transition region is slowly changed to a state of applying a voltage at a region other than the transition region, that is, a region between the point A and the point E, thereby, while maintaining the size of the gap 40 between the electrodes corresponding to the end of the transition region, that is, the applied voltage at the point A, the state becomes a state that the voltage is removed, or a state that a lower voltage is applied. These operations each are writing operation for the non-volatile memory device 100, and as a result of the writing operation, it is possible to obtain a state that the gap 40 between the electrodes is larger, that is, a higher resistance state, and a state that the gap 40 between the electrodes is smaller, that is, a lower resistance state. The higher resistance state or the lower resistance state is maintained as long as a voltage in the transition region is not applied to the nanogap electrodes.

Next, the reading-out operation of the non-volatile memory device 100 will be described. The reading-out can be performed by applying a voltage between the point A and the point E of FIG. 7 to the nanogap electrodes. By applying this voltage to measure a resistance value or a current value, it is possible to distinguish either the higher resistance state or the lower resistance state. Meanwhile, because the higher resistance state or the lower resistance state is maintained as long as a voltage in the transition region is not applied to the nanogap electrodes, if a voltage is applied by such reading-out, the state is not changed.

Next, the erasing operation of the non-volatile memory device 100 will be described. The erasing operation is to reset the state to either the lower resistance state or the higher resistance state. Information stored by the state of the nanogap electrodes can be deleted by applying a voltage in the transition region to the nanogap electrodes. In FIG. 7, by applying a voltage higher than the voltage at the point A, the gap 40 between the electrodes changes because the applied voltage is the voltage in the transition region. In the case where the state is a higher resistance state before applying such voltage, a voltage is applied to change the gap 40 between the electrodes to another size of gap 40 between the electrodes having said size corresponding to the applied voltage. Thus, thereafter, either one of the states can be formed, as similar to in the writing operation.

Next, the non-volatile property of the non-volatile memory device 100 will be described. Information to be stored in the non-volatile memory device 100 corresponds to a resistance state according to the change of the gap 40 between the nanogap electrodes as described above. Such resistance state is generated by migration in nano-scale level of atoms near the electrode tip. Such migration of a material is not generated as long as a voltage in the transition region is not applied. Accordingly, if a power source or the like is cut out, to remove a voltage which is applied to the nanogap electrodes, the size of the gap 40 between the electrodes, that is, the higher resistance state or the lower resistance state, can be maintained as it is.

In the non-volatile memory device 100 of the present embodiment, either one of the higher resistance state and the lower resistance state can be set to correspond to "0", and the other to correspond to "1", whereby the device can be operated as a memory device capable of obtaining two values (two digit values). Meanwhile, a manner that these states correspond to the values is arbitrarily determined.

The operations of the non-volatile memory device 100 are generally performed as described above, but many modifications with respect to the operation method can be made. For example, the resistance value in the higher resistance state depends on a voltage in the transition region to be applied immediately before. That is, as an applied voltage in the transition region is closer to the point A, a resistance value in the higher resistance state decreases. As a high voltage in the transition region is closer to, for example, the point C, a resistance value in the higher resistance state increases. (The dependency of a resistance value on a set voltage in the transition region will be further described in later in the item 5 and FIG. 14 of the Example section.) This shows that some resistance values can be set in the higher resistance state. Accordingly, for example, a resistance value in the lower resistance state and a plurality of resistance values in the higher resistance state correspond to "−1", "0" and "1", respectively, and three or more memory states are set, thereby to obtain a multilevel non-volatile memory device 100.

Figure 8:
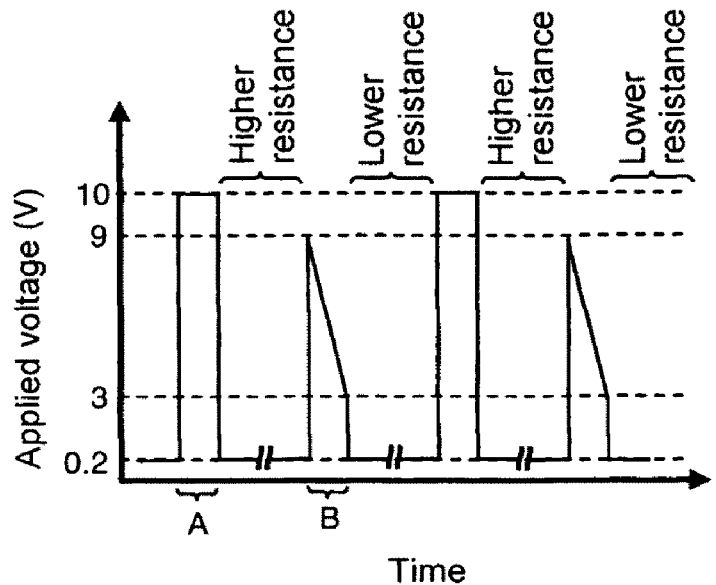
FIG. 8 is a schematic diagram showing one example of a voltage sequence for operating the non-volatile memory device.

Next, an example of the operation method of the non-volatile memory device 100 will be described, with referring to pulse sequence. The pulse sequence described herein is one example of pulse for obtaining alternating the higher resistance state and the lower resistance state. FIG. 8 schematically shows the sequence of a voltage to be applied to between the nanogap electrodes of the non-volatile memory device 100. The horizontal axis of FIG. 8 indicates an elapsed time, and the vertical axis indicates an applied voltage.

First, a rectangular pulse (a square pulse), as shown in A of FIG. 8, is applied. The maximum voltage of the rectangular pulse A is 10 V in this example. 10 V in this case is a voltage in the transition region of FIG. 7. Thus, the tip of the nanogap electrodes deforms, to form a state of having the gap 40 between the electrodes corresponding to 10 V. It is preferred that the width of the rectangular pulse A is in an extent of a time required for causing migration of the atoms of the electrodes. The width of the rectangular pulse A can be set to, for example, 1 s. The state that sequentially a voltage is rapidly changed to 0.2 V is a region which is indicated as 'Higher resistance' in FIG. 8 and corresponds to a region in the vicinity of the point '0' in FIG. 7. It is preferred that the changing speed of voltage in this case is in such an extent that the migration of the atoms of the electrodes cannot keep up with the change of voltage. This speed depends, for example, on the material, shape and temperature of the electrodes, and for example, it can be set to 5 $\mu sV^{-1}$. Herein, the voltage of 0.2 V corresponds to a measured voltage, and it can be used as a reading-out voltage as described above. A current which is measured in this higher resistance region is remarkably small. That is, a higher resistance state is obtained in this region.

Then, a wedge pulse B, as shown in B of FIG. 8, is applied. The maximum voltage of the wedge pulse B is 9 V in this example. 9 V in this case is a voltage in the transition region of FIG. 7. Thus, the tip of the nanogap electrodes deforms, to form a state of having the gap 40 between the electrodes corresponding to 9 V. The speed of decreasing the voltage of a wedge-shaped pulse B is smaller than that of the rectangular pulse A. It is preferred that the changing speed of voltage in this case is in such an extent that the migration of the atoms of the electrodes can keep up with the change of voltage. This speed depends, for example, on the material, shape and temperature of the electrodes, and for example, it can be set to 5 $\mu sV^{-1}$. The example as shown in the figure shows the wedge-shaped pulse B which is formed such that the speed at the time of decreasing the voltage from 9 V to 3 V becomes small. That is, it shows a case where a threshold voltage is in the voltage range from 9 V to 3 V. The state that sequentially a voltage is rapidly changed to 0.2 V is a region which is designated as 'Low resistance' in FIG. 8 and corresponds to a region in the vicinity of the point '0' in FIG. 7. The changing speed of voltage on this case is arbitrarily determined. Herein, the voltage of 0.2 V corresponds to a measured voltage, and it can be used as a reading-out voltage as described above. A current which is measured in this lower resistance region is large. That is, a lower resistance state is obtained in this region.

As described above, by selecting the pulse sequence, the resistance state of the nanogap electrodes of the non-volatile memory device 100 can be freely changed. Further, the driving method of the non-volatile memory device 100 can utilize sequence having various pulse patterns, in addition to the above-described rectangular (or square) wave and wedge-shaped wave.

4. Action and Effect

The non-volatile memory device 100 of the present embodiment has a remarkably simple structure, and can stably form a state of a higher electrical resistance between the electrodes and a state of a lower electrical resistance between the electrodes. The non-volatile memory device 100 of the present embodiment has a remarkably simple structure including nanogap electrodes and not requiring organic molecules and inorganic particles other than the electrodes. Further, since the non-volatile memory device 100 of the present embodiment does not contain a material which degrades, the device can stably form the state of a higher electrical resistance and the state of a lower electrical resistance between the electrodes and also can repeatedly form these states. Therefore, writing, erasing and reading-out operations can be repeatedly performed with stability. Furthermore, since these states are formed according to the change of a shape in the vicinity of the tip portions of the electrodes, these states are maintained even in a state of not applying a voltage. Therefore, the non-volatile memory device 100 of the present embodiment is a memory device having a non-volatile property.

5. Example

The present invention will be described in more detail based on the following examples, but the invention is not intended to be limited thereto. Some examples of the non-volatile memory device 100 of the aforementioned embodiment will be described below. The following examples are not to unreasonably limit the scope of the invention set forth in the claims.

As the insulating substrate 10, a silicon substrate coated with a silicon oxide layer of thickness 300 nm was used. The thickness of the first resist pattern was set to 1 μm. The first resist pattern was formed such that the width W1 of the first electrode lower part 22 in a horizontal direction would become 100 μm. The first electrode lower part 22 was formed by vapor-depositing chromium of thickness 2 nm on a portion in contact with the insulating substrate 10, and then vapor-depositing gold thereon, to have the total thickness of 25 nm. The angle θ1 of the inclined deposition in the first vapor-deposition step was set to 75°. The thickness of the second resist pattern was set to 1 μm. The second resist pattern was formed such that the width W2 of the second electrode 30 in a horizontal direction would become 2 μm. The second electrode 30 was formed by vapor-depositing chromium of thickness 2 nm on a portion in contact with the insulating substrate 10, and then vapor-depositing gold thereon, to have the total thickness of 15 nm. Thus, the whole thickness of the first electrode 20 became about 40 nm. The angle θ2 of the inclined deposition in the second vapor-deposition step was set to 60°. Then, the second lift-off step was performed. Because the non-volatile memory device 100 in the above state included one in which the first electrode 20 and the second electrode 30 occurred short-circuit, the electric field breaking step was performed, to remove a short-circuit portion. The electric field breaking conditions were set to an applied voltage of 1 V and a resistance Rc of 100Ω, and this step was performed by gradually decreasing the variable resistance Rv from 100 kΩ to 0Ω and gradually increasing a current amount. The current amount at the time of generating electric field breaking was about 4 mA. As described above, the non-volatile memory device 100 was obtained. The thus-obtained non-volatile memory device 100 was arranged in a vacuum chamber. The pressure of the inside of the vacuum chamber was $10^{-5}$ Pa order. An experimental circuit was connected to each electrode by using a microprobe element, and the operation and measurement of the resultant devices were performed.

Figure 9:
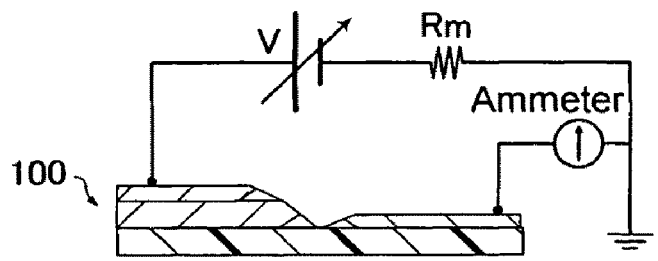
FIG. 9 is a circuit diagram schematically showing an operation-and-resistance measuring circuit of the non-volatile memory device.
Figure 10:
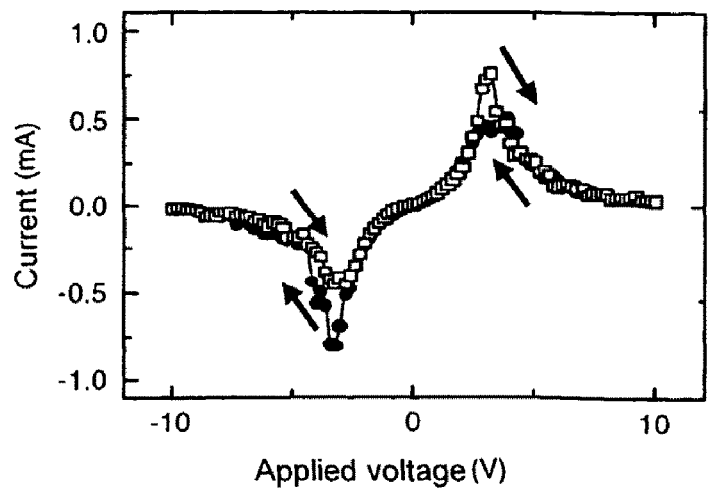
FIG. 10 is a plotting showing the measurement results of current-voltage characteristics of the non-volatile memory device 100.

FIG. 9 is a schematic diagram of a circuit to be used for evaluating the device characteristics. FIG. 10 is a graph showing the measurement results of I-V characteristics of the non-volatile memory device 100 of the present embodiment. The horizontal axis of the graph of FIG. 10 indicates a net voltage (bias voltage) applied to the non-volatile memory device 100, which net value is obtained by subtracting the voltage of both ends of the fixed resistance Rm from a circuit voltage. The vertical axis of FIG. 10 indicates a value of a current flowing at each time of applying the voltage which was measured with an ammeter. The measurement of I-V characteristics in FIG. 10 was performed, by setting an applied voltage at the start time of the measurement to +10 V, thereafter sweeping the voltage to −10 V at the sweep speed of −5 $sV^{-1}$, and then sweeping the voltage to +10 V at the sweep speed of 5 $sV^{-1}$. FIG. 10 was very similar to FIG. 7 as explained in the above.

As can be seen from FIG. 10, the I-V curve of the non-volatile memory device 100 of the present embodiment shows the maximum absolute value of a current in the vicinity of the applied voltage of +4 V and −4 V. At a voltage larger than +4 V, the absolute value of the current decreased, and also at a voltage smaller than −4 V, the absolute value of the current decreased. Although not shown in the drawings, this measurement was repeated 200 times and reproduction was good. Thus, it was found that the threshold voltage of the non-volatile memory device 100 of the this example was present in the vicinity of ±4 V. Therefore, the experiment was performed according to the pulse sequence as shown in FIG. 8.

Figure 11:
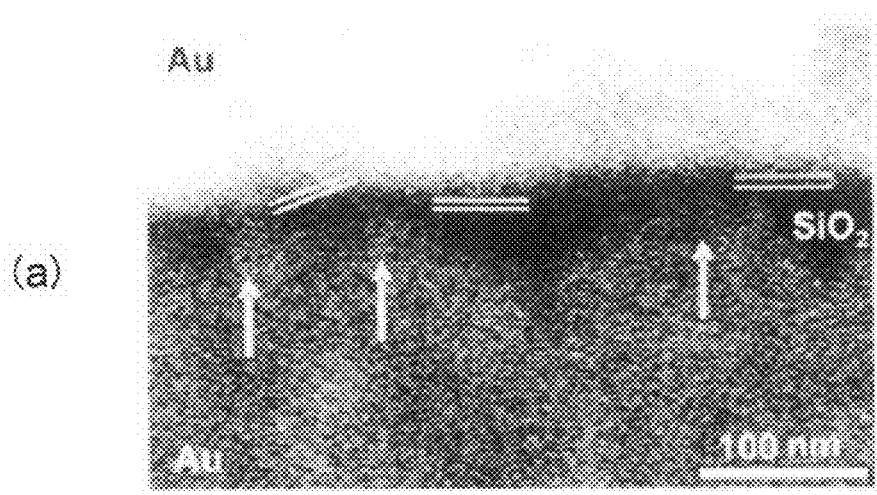
FIG. 11 shows SEM images (photographs) (FIGS. 11(a) and 11(b)) and a schematic diagram (FIG. 11(c)) of the main part of the non-volatile memory device 100 according to an embodiment of the present invention.
Figure 11:
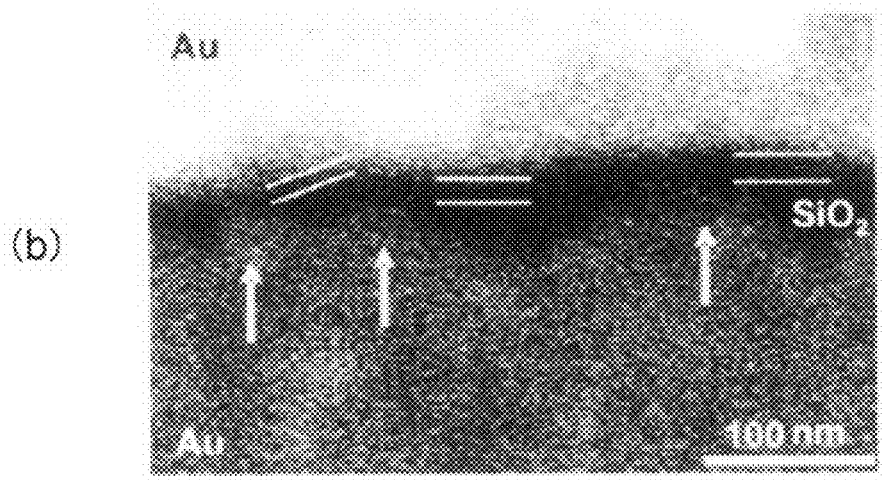
Figure 11:
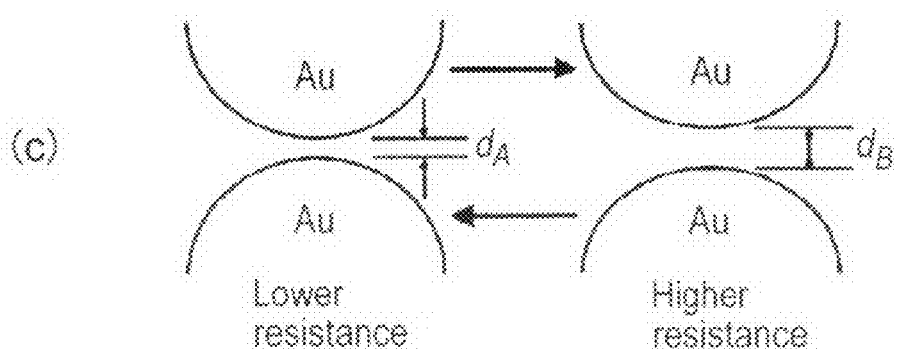

FIG. 11(*a*) and FIG. 11(*b*) show the results of observation of the non-volatile memory device 100 of the this example with a scanning electron microscope. FIG. 11(*c*) is a schematic diagram illustrating the results of FIG. 11(*a*) and FIG. 11(*b*). As the scanning electron microscope, S-4300 (trade name, manufactured by Hitachi Ltd.) was used, and they were photographed at an accelerated voltage of 15 kV. Since a heating stage was used and the scanning speed was made faster, the resolution was about 5 nm. The SEM images of FIG. 11(*a*) and FIG. 11(*b*) were obtained by photographing a part of the first electrode 20 (upper side), a part of the second electrode 30 (lower side), and a part of the gap 40 between the electrodes (dark portion in horizontal direction at the center of the photograph). In these drawings, the electrodes are depicted as Au, and the gap 40 between the electrodes is depicted as SiO$_2$. The arrows in FIG. 11(a) and FIG. 11(b) indicate portions where the electrodes were proximate to each other, and two lines were drawn as auxiliary lines for reading the distance G on the right side of each of the arrows.

FIG. 11(a) shows the observation result in the lower resistance state. In FIG. 11(a), a plurality of portions where the first electrode 20 and the second electrode 30 were proximate to each other were observed in the gap 40 between the electrodes. The width of each gap was measured, to find that the distance G between the first electrode 20 and the second electrode 30 was about 4 nm in the range of the observed region. The closest site between two electrodes of the non-volatile memory device 100 is expected to be present in a region other than the thus-observed region. In the case where the distance is smaller at the closest site, measurement is impossible because the resolution of the microscope is insufficient. Therefore, the distance at the closest site between two electrodes was calculated from the obtained resistance values. Since the electrical resistance value between the two electrodes in the lower resistance state was 60.5 kΩ, it was found that the distance was at least 0.1 nm or more, by calculation based on the tunnelling effect. That is, it was found the distance G ($d_A$) shown on the left side of FIG. 11(c) was 0.1 nm or more.

FIG. 11(b) shows the observation result in the higher resistance state. In FIG. 11(b) also, a plurality of portions where the first electrode 20 and the second electrode 30 were proximate to each other were observed in the gap 40 between the electrodes, similar to FIG. 11(a). The width of each gap was measured, to find that the distance G between the first electrode 20 and the second electrode 30 was about 9 nm in the range of the observed region. The closest site between two electrodes of the non-volatile memory device 100 is expected to be present in a region other than the thus-observed region. In the case where the distance is smaller at the closest site, measurement is impossible because the resolution of the microscope is insufficient. Therefore, the distance at the closest site between two electrodes was calculated from the obtained resistance values. Since the electrical resistance value between the two electrodes in the higher resistance state was about 11.7 GΩ, it was found that the distance was about 1.5 nm, by calculation based on the tunnelling effect. That is, it was found that the distance $d_B$ shown on the right side of FIG. 11(c) was 1.5 nm or around.

Figure 12:
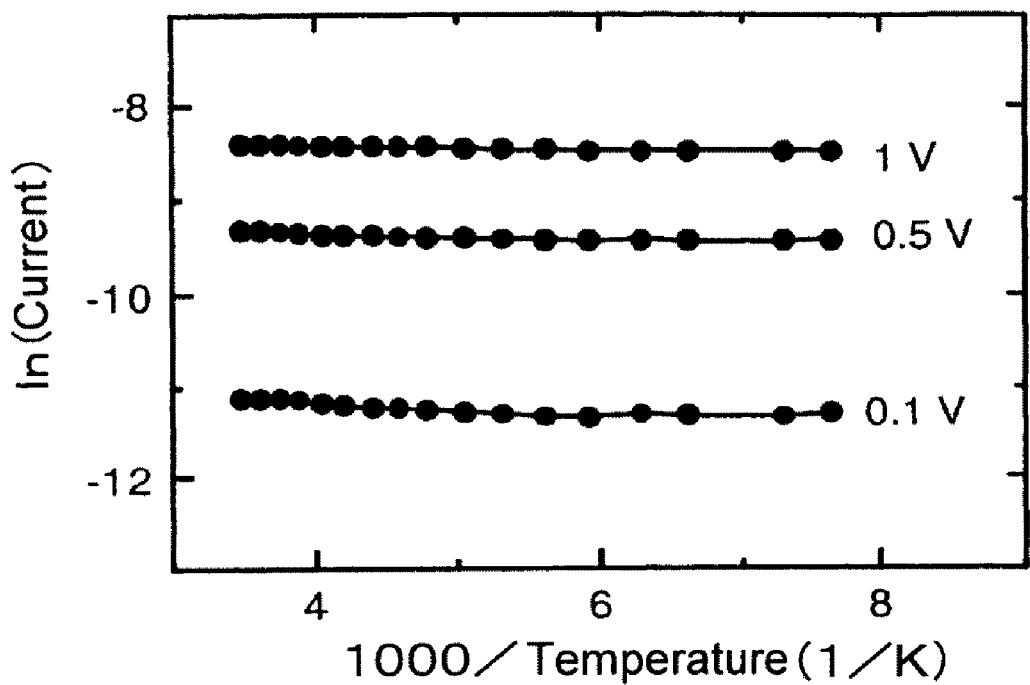
FIG. 12 is a plotting showing the measurement results of the temperature dependency of resistance of the non-volatile memory device according to the embodiment of the present invention.

FIG. 12 shows the temperature dependency on a measured current in the lower resistance state. The horizontal axis of FIG. 12 indicates a measured temperature as 1000 times a reciprocal number of an absolute temperature thereof, and the vertical axis of FIG. 12 indicates the logarithmic value of a measured current. The V value in FIG. 12 indicates a measure voltage. From FIG. 12, it was found that the non-volatile memory device 100 of the this example in the lower resistance state hardly had a temperature dependency. Thus, it is presumed that the measured current is not a current which flows by contact of the first electrode 20 with the second electrode 30. Thus, it is considered that a current flowing in the lower resistance state has the property of a tunnelling current, and it is presumed that the gap 40 between the electrodes is formed between the first electrode 20 and the second electrode 30.

Figure 13:
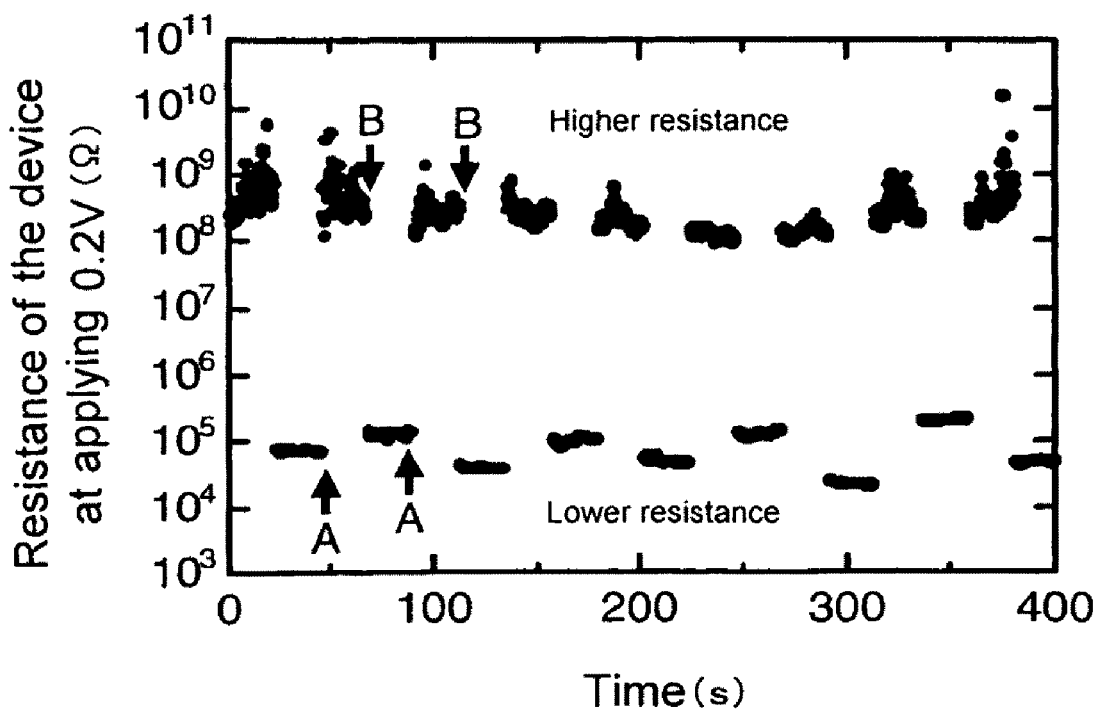
FIG. 13 is a plotting of the resistance value in repeating operations of the non-volatile memory device.

A part of the results of the resistance measurement in the this example is shown in FIG. 13. In FIG. 13, the horizontal axis indicates an elapsed time, and the vertical axis indicates a resistance value at the time of applying a voltage of +0.2 V. The arrow A of FIG. 13 means that the rectangular pulse A in FIG. 8 was applied, and the arrow B of FIG. 13 means that the wedge-shaped pulse B in FIG. 8 was applied. As shown in FIG. 13, even when the non-volatile memory device 100 of the present embodiment was operated in a manner of forming alternating higher and lower resistance states, the resistance value in each state hardly changed from those at the beginning of the measurement. In this case, the resistance value between the first electrode 20 and the second electrode 30 of the non-volatile memory device 100 was in the range of 10 kΩ to 200 kΩ in the lower resistance state and in the range of 100 MΩ to 10 GΩ in the higher resistance state.

Figure 14:
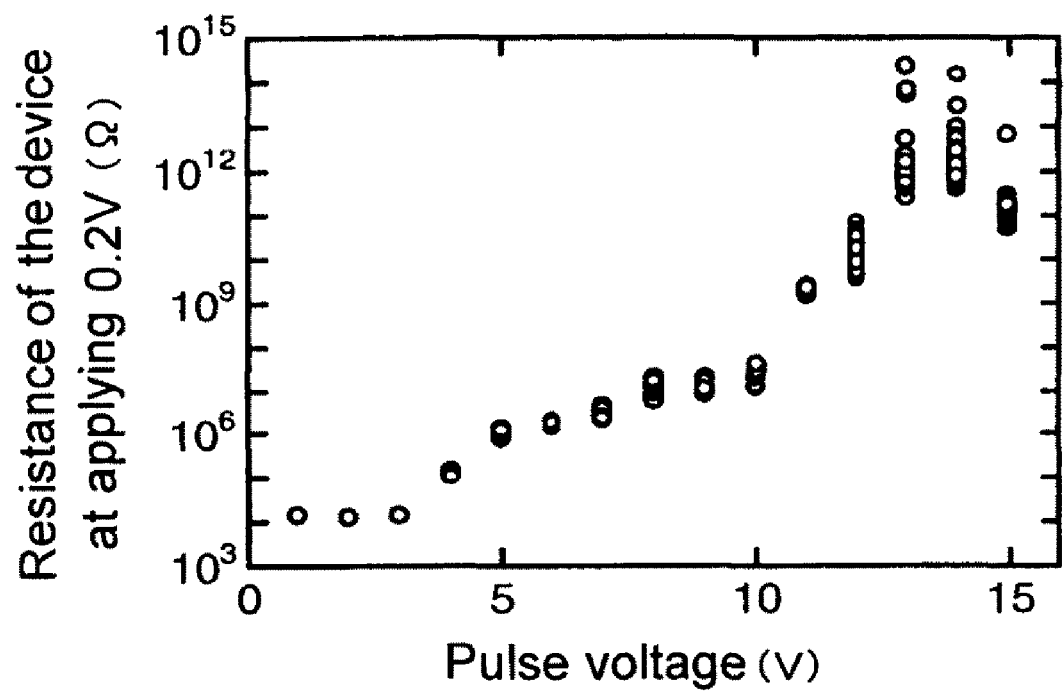
FIG. 14 is a plotting of the resistance value in a lower resistance state to the voltage of rectangular pulse.

FIG. 14 is a graph of plotting of the maximum voltage of a pulse to be applied for forming the higher resistance state, and a resistance value between both ends of the non-volatile memory device 100 immediately after applying the pulse, in which the horizontal axis indicates the maximum voltage of the pulse and the vertical axis indicates the resistance value. When FIG. 14 is described with referring to FIG. 8, FIG. 14 is a graph upon repeating the measurement, in which the initial voltage of a rectangular pulse A of 100 ms was applied and thereafter a resistance in the region of the higher resistance state was measured, and in which the horizontal axis indicates the pulse voltage and the vertical axis indicates the resistance value. From FIG. 14, it was found that when the voltage of the rectangular pulse A becomes larger than a point in the vicinity of +5 V, the resistance value exceeds 100 kΩ and the higher resistance state is accomplished. Further, when the voltage of the rectangular pulse A is made larger and exceeds a point in the vicinity of +10 V, the resistance value exceeds 1 GΩ, and when the voltage of the pulse exceeds a point in the vicinity of +13 V, the resistance value exceeds 1 TΩ. That is, it was found that the non-volatile memory device 100 is a device in which a resistance value in the higher resistance state can be arbitrarily set, according to the magnitude of a pulse voltage for making the higher resistance state. In addition to this, since the lower resistance state can be obtained in the vicinity of +4 V, the non-volatile memory device 100 can arbitrarily have resistance states in at least four stages. For example, as the resistance values in the respective states, 1 kΩ to 1 MΩ, 1 MΩ to 1 GΩ, 1 GΩ to 1 TΩ, and 1 TΩ to 1 PΩ can be generated. Thus, it was found that the non-volatile memory device 100 has a potential for application in a memory device, utilizing a relatively smaller resistance value and a relatively larger resistance value which are arbitral two states selected from the aforementioned resistance states; and that it has a further potential for application in a memory device utilizing three or more states. In the case of selecting two states, for example, a resistance value between the first electrode 20 and the second electrode 30 can be set to the first resistance value selected from a range of 1 kΩ to 10 MΩ, and the second resistance value selected from a range of 100 kΩ to 100 TΩ. Further, by selecting the first resistance value so as to become smaller than the second resistance value, the non-volatile memory device 100 of a binary level type can be obtained.

Figure 15:
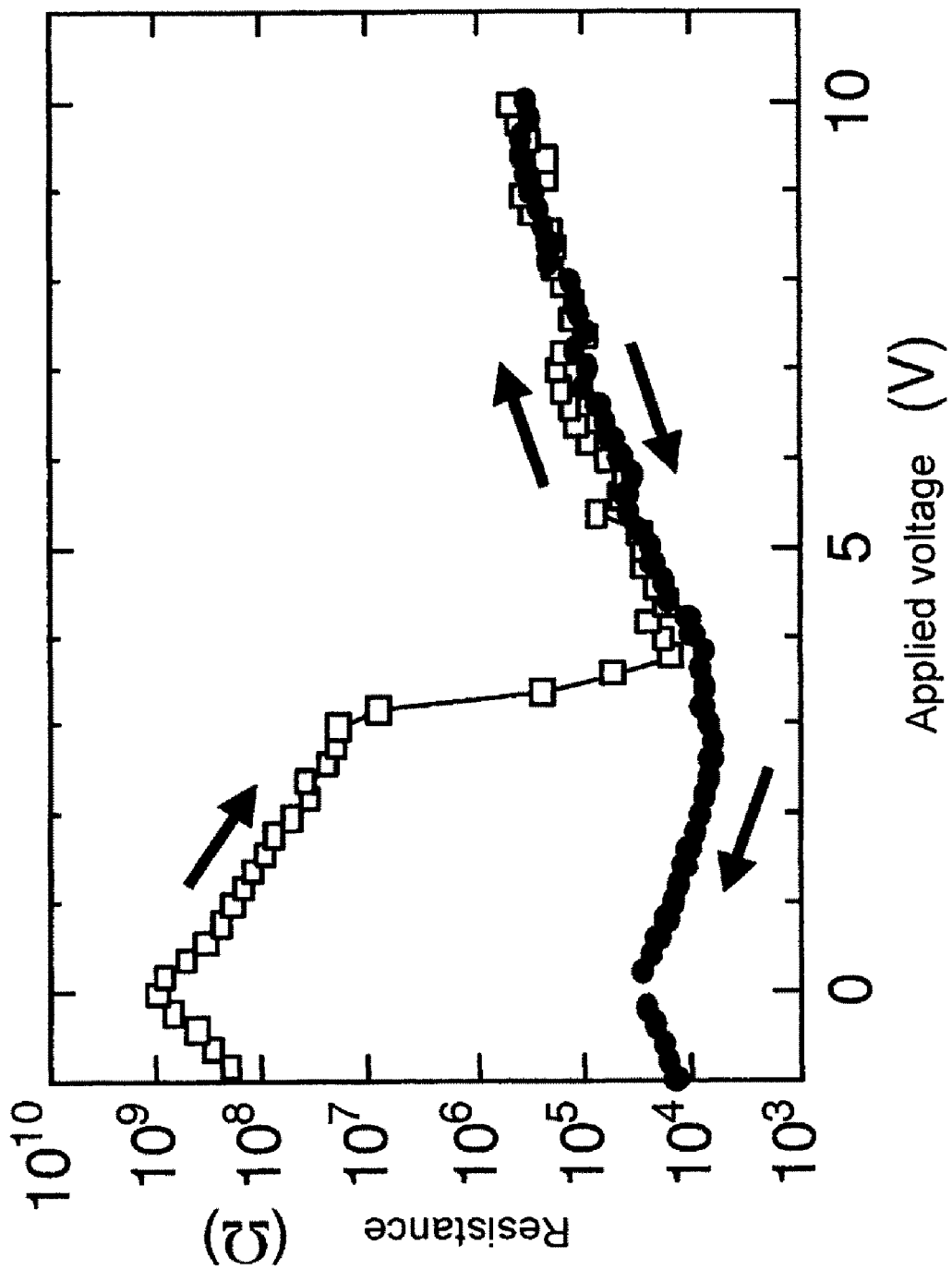
FIG. 15 is a plotting showing the results of a voltage sweeping experiment for the non-volatile memory device.

FIG. 15 shows a resistance-voltage curve in the case where the nanogap electrodes of the non-volatile memory device 100 were set to the higher resistance state. The horizontal axis of FIG. 15 indicates an applied voltage and the vertical axis of FIG. 15 indicates a resistance value. At first, −10 V was applied to the nanogap electrodes of the non-volatile memory device 100, the applied voltage was rapidly changed to −1 V at the speed of 5 μsV$^{-1}$, and the nanogap electrodes in the higher resistance state was formed. The resistance value in this case was about 2×10$^8$Ω (□, open square, on the upper left side of the figure). Then, as shown with the arrow in the figure, a voltage was swept up to +10 V at the sweeping speed of 5 sV$^{-1}$ and further swept up to −10 V at the sweeping speed of −5 sV$^{-1}$, and a resistance value was measured during the sweeping operation.

As can be seen form FIG. 15, when a voltage was increased from −1 V to reach about 3.5 V, a resistance value was rapidly decreased. This shows that the voltage applied to the nanogap electrodes which had been in the higher resistance state reached the transition region as described in the item of the 'operation', and the migration of atoms occurred, to make the gap 40 between the electrodes narrower, thereby allowing a tunnelling current. After the applied voltage reached +10 V, a resistance value was not rapidly changed when a voltage was slowly decreased. This shows that since a decreasing speed of the applied voltage was as low as 5 sV$^{-1}$, the migration of atoms was able to keep up with the voltage change, and the gap 40 between the electrodes corresponding to a voltage in the vicinity of 3.5 V, i.e. an end of the transition region, was formed. That is, in the case of 3.5 V or less, the nanogap electrodes were in the lower resistance state, and as shown in FIG. 10, they were in the state that a current flowed, which corresponded to the maximum point on the right side of the figure indicated as a closed circle. Thus, it was found that in the non-volatile memory device 100 of the this example, two states of the higher resistance state and the lower resistance state are obtained, respective states can be freely obtained and they each have a non-volatile property.

Figure 16:
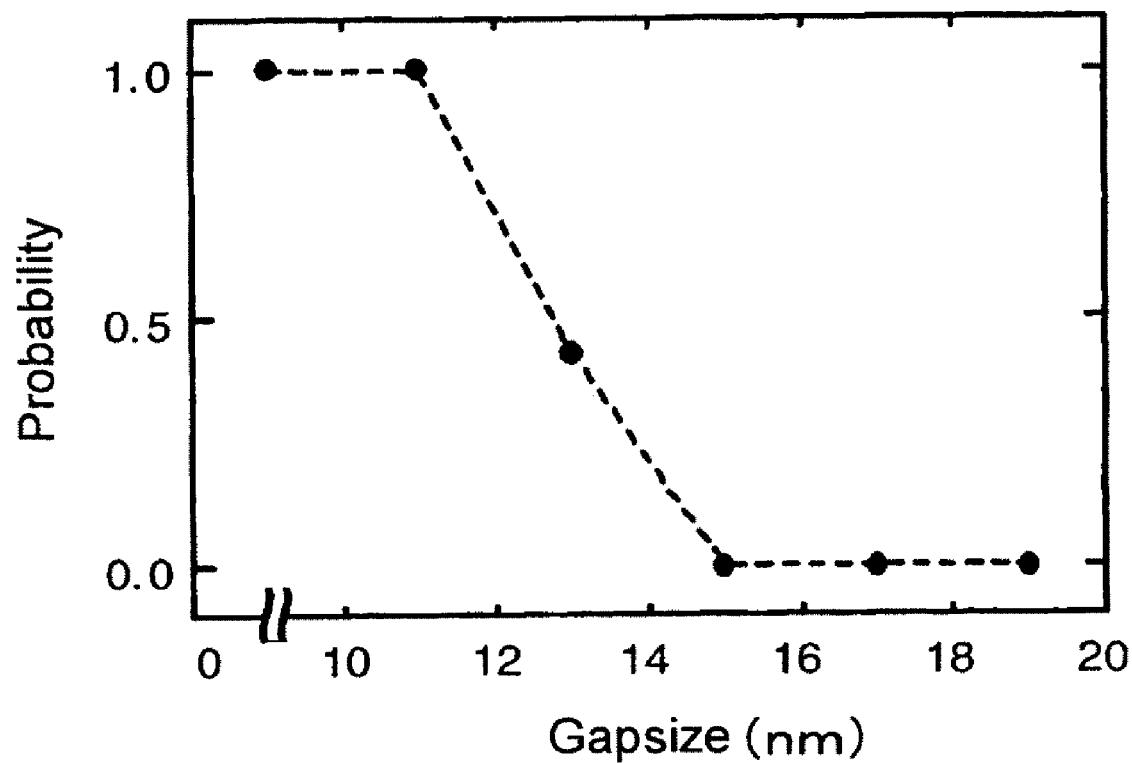
FIG. 16 is a plotting showing the experiment for searching a probability of obtaining a characteristic current-voltage curve.

FIG. 16 shows the experimental results on the range of the gap 40 between the electrodes after conducting the second lift-off step (7) in the production of the nanogap electrodes. In the experiment of FIG. 16, 50 or more samples having various distances G of the gap 40 between the electrodes were prepared, respective samples were evaluated by an electron microscope, and various distances G of the gap 40 between the electrodes were classified into different gap size (width) groups. Further, current-voltage measurement of all samples was performed. The horizontal axis of FIG. 16 indicates the measured value of the distance G of the gap 40 between the electrodes at the time of the completion of the second lift-off step by a scanning electron microscope. The vertical axis of FIG. 16 indicates the probability of the numbers of samples for determining whether or not the characteristic I-V curve, as shown in FIG. 10, would be obtained and for obtaining the characteristic curve with respect to the number of samples at each point. From FIG. 16, it was found that in the case of using gold as the material of the electrodes, if the distance G after the completion of the second lift-off step was shorter than 15 nm, or shorter than 13 nm, there was a high probability of obtaining the characteristic I-V curve, as shown in FIG. 10.

As described above, the non-volatile memory device 100 according to the present embodiment is a memory device having a remarkably simple structure, without using a component, such as an organic molecule or nanoparticles. Further, the non-volatile memory device 100 can stably repeat the operations of writing, erasing, and reading-out.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119(a) on Patent Application No. 2007-077212 filed in Japan on Mar. 23, 2007, which is entirely herein incorporated by reference. Further, the inventors of the present invention reported an article in Nanotechnology 17 (2006) 5669-5674, published on Oct. 30, 2006, which is entirely herein incorporated by reference.

What we claim is:

1. A non-volatile memory device, comprising:
an insulating substrate;
a first electrode provided on the insulating substrate;
a second electrode provided on the insulating substrate;
a gap set between the first electrode and the second electrode; and
controller configured to change a bias voltage applied to the first electrode and the second electrode, to change a distance G of the gap set between the first electrode and the second electrode in a range of 0 nm<G≦50 nm,
wherein the bias voltage is a voltage in a transition region, and the bias voltage is changed to a voltage at a region other than the transition region,
wherein the distance G is changed with resistance between the first and the second electrodes, to set a first resistance value or a second resistance value which is larger than the first resistance value, and to maintain the first resistance value or the second resistance value which is larger than the first resistance value.

2. The non-volatile memory device according to claim 1, wherein an electrical resistance value between the first electrode and the second electrode is either the first resistance value of 1 kΩ to 100 MΩ or the second resistance value of 10 kΩ to 100 TΩ, and the second resistance value is larger than the first resistance value.

3. The non-volatile memory device according to claim 1, wherein an electrical resistance value between the first electrode and the second electrode is either the first resistance value of 1 kΩ to 10 MΩ or the second resistance value of 100 kΩ to 100 TΩ, and the second resistance value is larger than the first resistance value.

4. The non-volatile memory device according to claim 3, wherein an electrical resistance value between the first electrode and the second electrode is either the first resistance value of 1 kΩ to 100 MΩ or the second resistance value of 10 kΩ to 100 TΩ, and the second resistance value is larger than the first resistance value.

5. The non-volatile memory device according to claim 3, wherein an electrical resistance value between the first electrode and the second electrode is either the first resistance value of 1 kΩ to 10 MΩ or the second resistance value of 100 kΩ to 100 TΩ, and the second resistance value is larger than the first resistance value.

6. The non-volatile memory device according to claim 1, wherein the distance G of the gap set between the first electrode and the second electrode is 0.1 nm≦G≦20 nm.

7. The non-volatile memory device according to claim 1, wherein the distance G of the gap set between the first electrode and the second electrode is 0.1 nm≦G≦13 nm.

8. The non-volatile memory device according to claim 3, wherein the distance G of the gap set between the first electrode and the second electrode is 0.1 nm≦G≦20 nm.

9. The non-volatile memory device according to claim 3, wherein the distance G of the gap set between the first electrode and the second electrode is 0.1 nm≦G≦13 nm.

10. A non-volatile memory device, comprising:
an insulating substrate;
a first electrode provided on the insulating substrate;
a second electrode provided on the insulating substrate;
a gap set between the first electrode and the second electrode; and
controller configured to change a bias voltage applied to the first electrode and the second electrode, to change a distance G of the gap set between the first electrode and the second electrode in a range of 0 nm<G≦50 nm, wherein the bias voltage is higher than a threshold voltage;
an electrical resistance increases when the absolute value of the voltage increases, and the bias voltage is changed to a voltage outside the transition region, wherein the distance G is changed with resistance between the first and the second electrodes, to set a first resistance value or a second resistance value which is larger than the first resistance value, and to maintain the first resistance value or the second resistance value which is larger than the first resistance value.

* * * * *